(12) United States Patent
Ono

(10) Patent No.: US 7,816,765 B2
(45) Date of Patent: Oct. 19, 2010

(54) SILICON EPITAXIAL WAFER AND THE PRODUCTION METHOD THEREOF

(75) Inventor: Toshiaki Ono, Tokyo (JP)

(73) Assignee: Sumco Corporation, Tokyo (JP)

( * ) Notice: Subject to any disclaimer, the term of this patent is extended or adjusted under 35 U.S.C. 154(b) by 0 days.

(21) Appl. No.: 12/477,207

(22) Filed: Jun. 3, 2009

(65) Prior Publication Data

US 2009/0302432 A1    Dec. 10, 2009

(51) Int. Cl.
*H01L 29/04* (2006.01)
(52) U.S. Cl. ............... 257/613; 257/616; 257/E21.09; 438/478
(58) Field of Classification Search .......... 257/314, 257/324, E29.3, E29.309, 627, E29.004, 257/E21.09, 613, 616; 438/478, 483
See application file for complete search history.

(56) References Cited

U.S. PATENT DOCUMENTS 7,250,357 B2 *  7/2007  Senda et al. ............. 438/478

2004/0235274 A1 * 11/2004 Kurita et al. ............. 438/483
2006/0278157 A1 * 12/2006 Seuring et al. ............ 117/2

FOREIGN PATENT DOCUMENTS

JP    6-112120    4/1994

* cited by examiner

*Primary Examiner*—Roy K Potter
(74) *Attorney, Agent, or Firm*—Greenblum & Bernstein, P.L.C.

(57) ABSTRACT

A silicon epitaxial wafer obtained by growing a silicon epitaxial layer on a surface of a silicon wafer having a diameter of at least 300 mm produced by slicing a silicon single crystal ingot doped with boron and germanium grown by the Czochralski method, wherein boron is doped to be at a concentration of $8.5 \times 10^{18}$ (atoms/cm$^3$) or higher and germanium is doped to satisfy a relational expression (formula 1) below.

$$\left| 3 \times \frac{\left( \begin{array}{c} 4.64 \times 10^{-24} \cdot [Ge] - \\ 2.69 \times 10^{-23} \cdot [B] \end{array} \right)}{5.43} \times r^2 \times \frac{t_{epi}}{(t_{sub})^2} \right| \leq 26.$$ [Formula 1]

8 Claims, 1 Drawing Sheet

SILICON EPITAXIAL WAFER AND THE PRODUCTION METHOD THEREOF

BACKGROUND OF THE INVENTION

1. Field of the Invention

The present invention relates to a silicon epitaxial wafer and the production method thereof. Particularly, the present invention relates to a low specific resistance and large diameter silicon epitaxial wafer that has a reduced warpage and the production method thereof.

2. Description of the Related Art

In recent years, power semiconductor devices have been used for power control, etc. As a wafer for a power semiconductor device, a silicon epitaxial wafer obtained by growing a silicon epitaxial layer almost completely free from any crystal defects on a surface of a silicon wafer obtained by slicing a silicon single crystal ingot grown by the Czochralski (CZ) method is mainly used. Generally, a silicon wafer having a low specific resistance doped with a dopant at a high concentration is used as a silicon wafer for a power semiconductor device.

For attaining a further lower power consumption of a power semiconductor device, a silicon wafer having a lower specific resistance has been demanded. In the case of a p type silicon wafer, a silicon wafer having a low specific resistance is produced by doping, for instance, boron (B) as a dopant at a high concentration. In order to improve the productivity of semiconductor devices, silicon wafers with 300 mm diameter are mainly used instead of silicon wafers with 200 mm diameter. Further, a thickness of a silicon epitaxial layer is apt to increase in connection with a high withstand voltage of a power semiconductor device.

However, when growing a silicon epitaxial layer on a surface of a silicon wafer having a low specific resistance, warpage of the silicon epitaxial wafer is caused because a lattice constant of the silicon wafer and that of the silicon epitaxial layer are different. The warpage becomes larger when a diameter of the wafer becomes larger or when a thickness of the silicon epitaxial layer increases. When the warpage increases, it becomes difficult to make a mask and to hold the silicon epitaxial wafer with vacuum chuck in the device production process and if things come to the worst, it becomes impossible to manufacture semiconductor devices. Consequently, it has become a critical problem to reduce a warpage of a silicon epitaxial wafer as much as possible (See Patent Reference 1). Particularly, in a p/p+ silicon epitaxial wafer obtained by growing a silicon epitaxial layer on a surface of a silicon wafer into which boron is doped at a high concentration, a lattice constant difference is large between the silicon wafer (substrate) doped with boron and the epitaxial layer without being doped, consequently, there has been a disadvantage that a warpage amount of the wafer becomes large after the epitaxial growth.

Also it was found that a silicon epitaxial wafer obtained by growing a silicon epitaxial layer on a surface of a silicon single crystal wafer having a crystal orientation of (110) is more liable to be warped than a silicon epitaxial wafer obtained by growing a silicon epitaxial layer on a surface of a silicon single crystal wafer having a crystal orientation of (100).

[Patent Reference 1] Japanese Patent Laid-open Hei 6-112120

SUMMARY OF THE INVENTION

An object of the present invention is to reduce a warpage of a silicon epitaxial wafer obtained by growing a silicon epitaxial layer on a surface of a silicon wafer with low specific resistance and large diameter.

The present invention provides an improvement of a silicon epitaxial wafer obtained by growing a silicon epitaxial layer on a surface of a silicon wafer having a diameter of at least 300 mm produced by slicing a silicon single crystal ingot added with boron and germanium grown by the Czochralski method and the production method thereof.

The feature of the present invention exists in that a silicon wafer is doped to have a boron concentration of $8.5 \times 10^{18}$ (atoms/cm$^3$) or higher and doped with germanium in a range of satisfying the relational expression (Formula 1) below.

$$\left| 3 \times \frac{\left( \frac{4.64 \times 10^{-24} \cdot [Ge] -}{2.69 \times 10^{-23} \cdot [B]} \right)}{5.43} \times r^2 \times \frac{t_{epi}}{(t_{sub})^2} \right| \leq 26 \quad \text{[Formula 1]}$$

Particularly, the crystal orientation of the silicon wafer is preferably (110). Further, the thickness of the silicon epitaxial layer is preferably in the range from 4 μm through 20 μm. When the thickness is smaller than 41 μm, a warpage will not occur. When the thickness exceeds 20 μm, it requires that a doping amount of germanium into a silicon wafer (substrate) becomes high, leading to a rise of production cost.

According to the present invention, when obtaining a silicon epitaxial wafer obtained by growing a silicon epitaxial layer on a surface of a silicon wafer into which boron is doped at a high concentration, a doping amount (concentration) of germanium having a larger lattice constant than that of silicon is controlled to be in the range of the Formula 1; therefore, a warpage amount can be controlled to be smaller even in a large-diameter wafer having a diameter of 300 mm or larger.

BRIEF DESCRIPTION OF DRAWINGS

These and other objects and features of the present invention will become clearer from the following description of the preferred embodiments given with reference to the attached drawings, in which.

DESCRIPTION OF THE PREFERRED EMBODIMENT

Below, an embodiment of the present invention will be explained based on the drawings.

Figure 1:
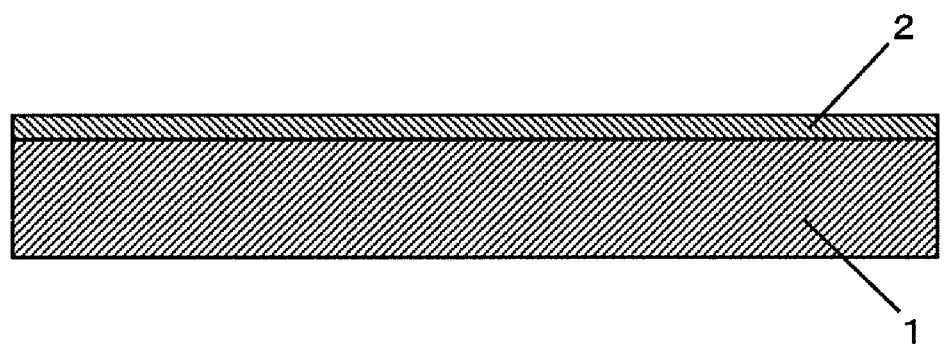
FIG. 1 is a sectional view of a silicon epitaxial wafer according to an embodiment of the present invention.

A silicon epitaxial wafer of the present embodiment is, as shown in FIG. 1, formed by growing a silicon epitaxial layer 2 on a surface of a silicon wafer 1. The silicon wafer 1 is obtained by slicing a silicon single crystal ingot grown by the Czochralski method and, during growing the ingot, boron and germanium are added to silicon melt. Boron is doped to attain a boron concentration of $8.5 \times 10^{18}$ (atoms/cm$^3$) or higher and germanium is doped to attain a concentration range of satisfying the above Formula 1.

The silicon wafer of the present embodiment has a large diameter of at least 300 mm and, in particular, has a crystal orientation of (110).

Next, an explanation will be made on the above Formula 1.

Figure 2:
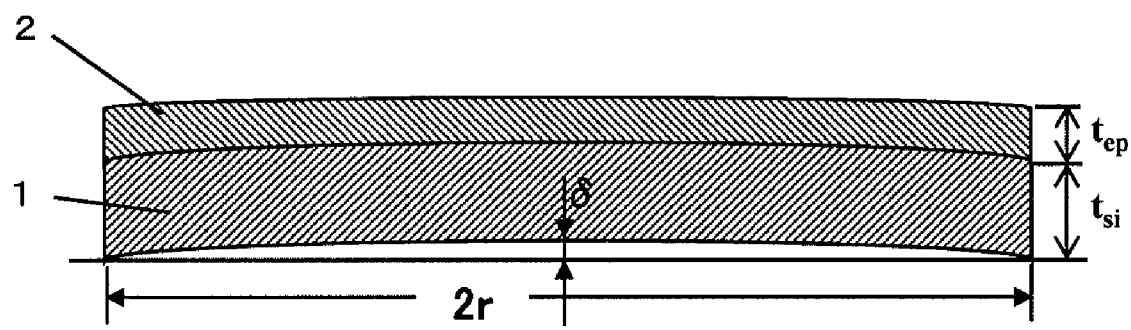
FIG. 2 is a sectional view for explaining a warpage amount of the silicon epitaxial wafer shown in FIG. 1.

As shown in FIG. 2, when there is a thin film on a wafer, distortion ε in the film is given by the formula (2) below. Note that an initial wafer warpage amount δ is assumed to be 0. Namely, it is to obtain a change of a warpage amount before and after growing an epitaxial layer.

In the Formula (2), $t_{si}$ indicates a thickness of a wafer, $t_{epi}$ a thickness of an epitaxial layer, δ a warpage amount of the wafer, and "r" a radius of the wafer.

$$\varepsilon = \frac{1}{3}\left(\frac{t_{si}^2}{t_{epi}}\right)\left(\frac{\delta}{r^2}\right) \quad \text{[Formula 2]}$$

Also, a distortion e due to a lattice constant difference between p+ and p− layers is obtained by the Formula (3) below. Here, $\Delta\alpha_{Si-B-Ge}$ is a lattice constant difference between p⁺ crystal containing [B] and [Ge] and p⁻ crystal without any doping, and $\alpha_{Si}$ is a lattice constant of the p⁻ crystal.

$$\varepsilon = \frac{\Delta\alpha_{si-B-Ge}}{\alpha_{si}} = \frac{4.64\times10^{-24}\times[Ge] - 2.69\times10^{-23}\times[B]}{5.43} \quad \text{[Formula 3]}$$

Note that $\Delta\alpha_{Si-B-Ge}$ is obtained as explained below. Namely, a lattice constant change ($\Delta\alpha_{Si-B}$, the unit is angstrom) due to a change of a boron concentration is calculated by the formula (Vegard's Law) below.

$$\Delta\alpha_{Si-B} = \alpha_{Si}\times(r_B - r_{Si})/r_{Si}\times[B]/[Si] \quad \text{[Formula 4]}$$

In the formula 4, $r_{Si}$ indicates a radius of a silicon (Si) atom, $r_B$ a radius of a boron (B) atom, [B] a boron concentration, and [Si] a silicon concentration. The radius of a silicon atom is 1.17 angstroms, and the radius of a boron atom is 0.88 angstrom. A lattice constant of a high purity silicon crystal ($\alpha_{Si}$) is 5.43 angstroms. A Si atom density of a silicon single crystal is $5.0\times10^{22}$ atoms/cm³.

Consequently, the formula (4) becomes a formula (5) below.

$$\Delta\alpha_{Si-B} = -2.69\times10^{-23}\times[B] \quad \text{[Formula 5]}$$

As is obvious from the formula (5), in the case of a silicon wafer doped with boron at a high concentration, the lattice constant becomes smaller comparing with that in the case of not adding any boron.

On the other hand, a lattice constant change in the case of doping germanium ($\Delta\alpha_{Si-Ge}$, the unit is angstrom) is also calculated in the same way by using the Vegard's Law.

$$\Delta\alpha_{Si-Ge} = \alpha_{Si}\times(r_{Ge} - r_{Si})/r_{Si}\times[Ge]/[Si] \quad \text{[Formula 6]}$$

Here, $r_{Ge}$ is a radius of a germanium atom, which is 1.22 angstroms, and [Ge] is a germanium concentration. Accordingly, the formula (6) can be expressed as a formula (7) below.

$$\Delta\alpha_{Si-Ge} = 4.64\times10^{-24} \quad \text{[Formula 7]}$$

Accordingly, the lattice constant becomes larger by adding germanium when comparing with that in the case of not adding any germanium.

From the above, a lattice constant change in the case of adding boron and germanium at the same time ($\Delta\alpha_{Si-Ge-B}$, the unit is angstrom) is obtained from a sum of the formula (5) and formula (7).

$$\Delta\alpha_{Si-Ge-B} = \Delta\alpha_{Si-Ge} + \Delta\alpha_{Si-B} = 4.64\times10^{-24}\times[Ge] - 2.69\times10^{-23}\times[B] \quad \text{[Formula 8]}$$

This $\Delta\alpha_{Si-Ge-B}$ above is the numerator in the formula (3), and the lattice constant of high purity silicon crystal ($\alpha_{Si}$) is 5.43 angstroms as explained above, therefore, the formula (3) can be solved.

Then, by eliminating ε from the formula (2) and formula (3), it is possible to obtain a relationship of δ, [B], $t_{Si}$, $t_{epi}$ and r. Namely, $$\left|3\times\frac{\left(\begin{array}{c}4.64\times10^{-24}\cdot[Ge] - \\ 2.69\times10^{-23}\cdot[B]\end{array}\right)}{5.43}\times r^2 \times \frac{t_{epi}}{(t_{sub})^2}\right| = \delta \quad \text{[Formula 9]}$$

from the formula (9), it is known that a warpage amount of the p/p⁺ epitaxial wafer due to the epitaxial growth is proportional to a boron concentration, epitaxial layer thickness and a square of a wafer diameter and is in inverse proportion to a square of a wafer thickness.

As below, it was confirmed that a warpage amount of a wafer didn't exceed 18 μm when growing a silicon epitaxial layer to be in a range of 2.75 to 20 μm on a surface of a silicon wafer having a diameter of at least 300 mm produced by slicing a silicon single crystal ingot grown by the Czochralski method, doped to have a boron concentration of at least $8.5\times10^{18}$ (atoms/cm³) and doped with germanium in a range of satisfying the formula (1).

EXAMPLE 1

When growing a silicon single crystal ingot having a crystal orientation of (110) by the CZ method, silicon melt was doped with boron and germanium, so that the boron concentration becomes $2.01\times10^{19}$ atoms/cm³ and the germanium concentration becomes $2.03\times10^{19}$ atoms/cm³. Then, the ingot was sliced to produce a wafer having a diameter of 300 mm and a thickness of 774 μm.

The 300 mm-diameter wafer was placed in an epitaxial growth apparatus, hydrogen baking at 1150° C. was performed, then, a $SiHCl_3$ gas was supplied under a condition of 1075° C. in the epitaxial growth apparatus to grow an epitaxial layer having a thickness of 2.75 μm on a surface of the wafer and a p/p⁺ silicon epitaxial wafer was obtained.

A measurement of warpage of the silicon epitaxial wafer was made before and after the epitaxial growth, and an absolute value of a change of the warpage amount was calculated. The result is shown in Table 1. A calculated value of the left-hand side of the formula (1) above is also shown in Table 1.

EXAMPLE 2

Other than changing the boron concentration of doping in the silicon melt to $1.98\times10^{19}$ atoms/cm³, the germanium concentration to $1.01\times10^{20}$ atoms/cm³, the wafer thickness to 775 μm and the thickness of the epitaxial layer to 6 μm, a silicon epitaxial wafer was produced under the same condition as that in the Example 1. A measurement of warpage of the silicon epitaxial wafer was made before and after the epitaxial growth, and an absolute value of a change of the warpage amount was calculated. The result is shown in Table 1. A calculated value of the left-hand side of the formula (1) above is also shown in Table 1.

EXAMPLE 3

Other than changing the boron concentration of doping in the silicon melt to $1.21\times10^{19}$ atom s/cm$^3$, the germanium concentration to $9.00\times10^{18}$ atoms/cm$^3$ and the thickness of the epitaxial layer to 4 μm, a silicon epitaxial wafer was produced under the same condition as that in the Example 1. A measurement of warpage of the silicon epitaxial wafer was made before and after the epitaxial growth, and an absolute value of a change of the warpage amount was calculated. The result is shown in Table 1. A calculated value of the left-hand side of the formula (1) above is also shown in Table 1.

EXAMPLE 4

Other than changing the boron concentration of doping in the silicon melt to $1.21\times10^{19}$ atom s/cm$^3$, the germanium concentration to $4.03\times10^{19}$ atoms/cm$^3$, the wafer thickness to 775 μm and the thickness of the epitaxial layer to 6 μm, a silicon epitaxial wafer was produced under the same condition as that in the Example 1. A measurement of warpage of the silicon epitaxial wafer was made before and after the epitaxial growth, and an absolute value of a change of the warpage amount was calculated. The result is shown in Table 1. A calculated value of the left-hand side of the formula (1) above is also shown in Table 1.

EXAMPLE 5

Other than changing the boron concentration of doping in the silicon melt to $9.81\times10^{18}$ atom s/cm$^3$, the germanium concentration to $2.01\times10^{19}$ atoms/cm$^3$, the wafer thickness to 775 μm and the thickness of the epitaxial layer to 6 μm, a silicon epitaxial wafer was produced under the same condition as that in the Example 1. A measurement of warpage of the silicon epitaxial wafer was made before and after the epitaxial growth, and an absolute value of a change of the warpage amount was calculated. The result is shown in Table 1. A calculated value of the left-hand side of the formula (1) above is also shown in Table 1.

EXAMPLE 6

Other than changing the boron concentration of doping in the silicon melt to $1.95\times10^{19}$ atom s/cm$^3$, the germanium concentration to $1.01\times10^{20}$ atoms/cm$^3$, the wafer thickness to 775 μm and the thickness of the epitaxial layer to 20 μm, a silicon epitaxial wafer was produced under the same condition as that in the Example 1. A measurement of warpage of the silicon epitaxial wafer was made before and after the epitaxial growth, and an absolute value of a change of the warpage amount was calculated. The result is shown in Table 1. A calculated value of the left-hand side of the formula (1) above is also shown in Table 1.

COMPARATIVE EXAMPLE 1

As a comparative example of the Example 1, other than changing the boron concentration of doping in the silicon melt to $2.02\times10^{19}$ atom s/cm$^3$ and the wafer thickness to 773 μm and not doping any germanium, a silicon epitaxial wafer was produced under the same condition as that in the Example 1. A measurement of warpage of the silicon epitaxial wafer was made before and after the epitaxial growth, and an absolute value of a change of the warpage amount was calculated. The result is shown in Table 1.

COMPARATIVE EXAMPLE 2

As a comparative example of the Example 3, other than changing the boron concentration of doping in the silicon melt to $2.01\times10^{19}$ atom s/cm$^3$ and the wafer thickness to 775 μm and not doping any germanium, a silicon epitaxial wafer was produced under the same condition as that in the Example 3. A measurement of warpage of the silicon epitaxial wafer was made before and after the epitaxial growth, and an absolute value of a change of the warpage amount was calculated. The result is shown in Table 1.

COMPARATIVE EXAMPLE 3

As a comparative example of the Example 2, other than changing the boron concentration of doping in the silicon melt to $1.90\times10^{19}$ atom s/cm$^3$ and not doping any germanium, a silicon epitaxial wafer was produced under the same condition as that in the Example 2. A measurement of warpage of the silicon epitaxial wafer was made before and after the epitaxial growth, and an absolute value of a change of the warpage amount was calculated. The result is shown in Table 1.

COMPARATIVE EXAMPLE 4

As a comparative example of the Example 2, other than changing the boron concentration of doping in the silicon melt to $2.01\times10^{19}$ atom s/cm3 and the germanium concentration to $3.04\times10^{19}$ atoms/cm$^3$, a silicon epitaxial wafer was produced under the same condition as that in the Example 2. A measurement of warpage of the silicon epitaxial wafer was made before and after the epitaxial growth, and an absolute value of a change of the warpage amount was calculated. The result is shown in Table 1. A calculated value of the left-hand side of the formula (1) above is also shown in Table 1.

COMPARATIVE EXAMPLE 5

As a comparative example of the Example 3, other than changing the boron concentration of doping in the silicon melt to $1.23\times10^{19}$ atom s/cm$^3$ and the wafer thickness to 775 μm and not doping any germanium, a silicon epitaxial wafer was produced under the same condition as that in the Example 3. A measurement of warpage of the silicon epitaxial wafer was made before and after the epitaxial growth, and an absolute value of a change of the warpage amount was calculated. The result is shown in Table 1.

COMPARATIVE EXAMPLE 6

As a comparative example of the Example 4, other than changing the boron concentration of doping in the silicon melt to $1.20\times10^{19}$ atom s/cm$^3$ and not doping any germanium, a silicon epitaxial wafer was produced under the same condition as that in the Example 4. A measurement of warpage of the silicon epitaxial wafer was made before and after the epitaxial growth, and an absolute value of a change of the warpage amount was calculated. The result is shown in Table 1.

COMPARATIVE EXAMPLE 7

As a comparative example of the Example 5, other than changing the boron concentration of doping in the silicon melt to $9.70\times10^{18}$ atom s/cm$^3$ and the wafer thickness to 774 μm and not doping any germanium, a silicon epitaxial wafer was produced under the same condition as that in the Example 5. A measurement of warpage of the silicon epitaxial wafer was made before and after the epitaxial growth, and an absolute value of a change of the warpage amount was calculated. The result is shown in Table 1.

COMPARATIVE EXAMPLE 8

As a comparative example of the Example 5, other than changing the germanium concentration to $2.10 \times 10^{18}$ atoms/cm$^3$, a silicon epitaxial wafer was produced under the same condition as that in the Example 5. A measurement of warpage of the silicon epitaxial wafer was made before and after the epitaxial growth, and an absolute value of a change of the warpage amount was calculated. The result is shown in Table 1. A calculated value of the left-hand side of the formula (1) above is also shown in Table 1.

REFERENCE EXAMPLE 1

As a reference example of the Example 1, other than changing the wafer diameter to 200 mm, the wafer thickness to 723 µm and not doping any germanium, a silicon epitaxial wafer was produced under the same condition as that in the Example 1. A measurement of warpage of the silicon epitaxial wafer was made before and after the epitaxial growth, and an absolute value of a change of the warpage amount was calculated. The result is shown in Table 1.

REFERENCE EXAMPLE 2

As a reference example of the Example 3, other than changing the wafer diameter to 200 mm, the boron concentration of doping in the silicon melt to $1.80 \times 10^{19}$ atoms/cm$^3$ and the wafer thickness to 726 µm and not doping any germanium, a silicon epitaxial wafer was produced under the same condition as that in the Example 3. A measurement of warpage of the silicon epitaxial wafer was made before and after the epitaxial growth, and an absolute value of a change of the warpage amount was calculated. The result is shown in Table 1.

REFERENCE EXAMPLE 3

As a reference example of the Example 2, other than changing the wafer diameter to 200 mm, the wafer thickness to 721 µm and not doping any germanium, a silicon epitaxial wafer was produced under the same condition as that in the Example 2. A measurement of warpage of the silicon epitaxial wafer was made before and after the epitaxial growth, and an absolute value of a change of the warpage amount was calculated. The result is shown in Table 1.

REFERENCE EXAMPLE 4

As a reference example of the Example 1, other than changing the boron concentration of doping in the silicon melt to $1.20 \times 10^{19}$ atoms/cm$^3$ and not doping any germanium, a silicon epitaxial wafer was produced under the same condition as that in the Example 1. A measurement of warpage of the silicon epitaxial wafer was made before and after the epitaxial growth, and an absolute value of a change of the warpage amount was calculated. The result is shown in Table 1.

REFERENCE EXAMPLE 5

As a reference example of the Example 1, other than changing the boron concentration of doping in the silicon melt to $9.70 \times 10^{18}$ atoms/cm$^3$, the thickness of the epitaxial layer to 2.27 µm and not doping any germanium, a silicon epitaxial wafer was produced under the same condition as that in the Example 1. A measurement of warpage of the silicon epitaxial wafer was made before and after the epitaxial growth, and an absolute value of a change of the warpage amount was calculated. The result is shown in Table 1.

TABLE 1

| | Wafer Diameter (mm) | Boron Concentration of Wafer (atoms/cc) | Germanium Concentration of Wafer (atomc/cc) | Wafer Thickness (µm) | Epitaxial Film Thickness (µm) | Warpage Amount Change Before and After Epitaxial Film Growth (µm) | Calculated Value of Left-Hand Side of Formula 1 |
|---|---|---|---|---|---|---|---|
| Example 1 | 300 | $2.01 \times 10^{19}$ | $2.03 \times 10^{19}$ | 774 | 2.75 | 17.1 | 25.6 |
| Example 2 | 300 | $1.98 \times 10^{19}$ | $1.01 \times 10^{20}$ | 775 | 6 | 5.7 | 9 |
| Example 3 | 300 | $1.21 \times 10^{19}$ | $9.00 \times 10^{18}$ | 774 | 4 | 13.4 | 23.9 |
| Example 4 | 300 | $1.21 \times 10^{19}$ | $4.03 \times 10^{19}$ | 775 | 6 | 6.5 | 17.2 |
| Example 5 | 300 | $9.81 \times 10^{18}$ | $2.01 \times 10^{19}$ | 775 | 6 | 10.7 | 20.9 |
| Example 6 | 300 | $1.95 \times 10^{19}$ | $1.01 \times 10^{20}$ | 775 | 20 | 17.8 | 23.2 |
| Comparative Example 1 | 300 | $2.02 \times 10^{19}$ | — | 773 | 2.75 | 22.8 | — |
| Comparative Example 2 | 300 | $2.01 \times 10^{19}$ | — | 775 | 4 | 28.3 | — |
| Comparative Example 3 | 300 | $1.90 \times 10^{19}$ | — | 775 | 6 | 35.1 | — |
| Comparative Example 4 | 300 | $2.01 \times 10^{19}$ | $3.04 \times 10^{19}$ | 775 | 6 | 28.6 | 47.6 |
| Comparative Example 5 | 300 | $1.23 \times 10^{19}$ | — | 775 | 4 | 22.7 | — |
| Comparative Example 6 | 300 | $1.20 \times 10^{19}$ | — | 775 | 6 | 29.2 | — |
| Comparative Example 7 | 300 | $9.70 \times 10^{18}$ | — | 774 | 6 | 21.8 | — |
| Comparative Example 8 | 300 | $9.81 \times 10^{18}$ | $2.10 \times 10^{18}$ | 775 | 6 | 21.3 | 31.3 |
| Reference Example 1 | 200 | $2.01 \times 10^{19}$ | — | 723 | 2.75 | 7.8 | — |
| Reference Example 2 | 200 | $1.80 \times 10^{19}$ | — | 726 | 4 | 11.2 | — |
| Reference Example 3 | 200 | $1.98 \times 10^{19}$ | — | 721 | 6 | 17.5 | — |
| Reference Example 4 | 300 | $1.20 \times 10^{19}$ | — | 774 | 2.75 | 12 | — |
| Reference Example 5 | 300 | $9.70 \times 10^{18}$ | — | 774 | 2.27 | 8.5 | — |

Consideration

As shown in the Examples 1 to 6, in the 300 mm epitaxial wafers wherein an epitaxial layer is grown on wafers having a germanium concentration satisfying the formula (1), changes of the warpage amounts were preferable as 17.8 µm at maximum.

On the other hand, as the Comparative Examples 1 to 8 exhibit, in wafers without doping any germanium or wafers doped with germanium at a concentration being out of the formula (1), changes of the warpage amounts were 21.31 μm at minimum.

Note that, as in the Reference Examples 1 to 3, wafers having a small diameter of 200 mm do dot exhibit large changes in the warpage amount. Also, as in the Reference Examples 4 and 5, changes of the warpage amounts are not large in those having a thin epitaxial layer.

The embodiments explained above are for easier understanding of the present invention and not to limit the present invention. Accordingly, respective elements disclosed in the above embodiments include all modifications in designs and equivalents belonging to the technical field of the present invention.

Explanation of References

1 ... silicon wafer
2 ... silicon epitaxial layer

What is claimed is:

1. A silicon epitaxial wafer, obtained by growing a silicon epitaxial layer on a surface of a silicon wafer having a diameter of at least 300 mm produced by slicing a silicon single crystal ingot doped with boron and germanium grown by the Czochralski method, wherein
    boron is doped to be at a concentration of $8.5 \times 10^{18}$ (atoms/cm$^3$) or higher, and
    germanium is doped to satisfy a relational expression (formula 1) below:

$$\left| 3 \times \frac{\left( \begin{array}{c} 4.64 \times 10^{-24} \cdot [Ge] - \\ 2.69 \times 10^{-23} \cdot [B] \end{array} \right)}{5.43} \times r^2 \times \frac{t_{epi}}{(t_{sub})^2} \right| \leq 26. \quad \text{[Formula 1]}$$

2. The silicon epitaxial wafer as set forth in claim 1, wherein a crystal orientation of the silicon wafer is (110).

3. The silicon epitaxial wafer as set forth in claim 1, wherein a thickness of the silicon epitaxial layer is in the range from 4 μm through 20 μm.

4. The silicon epitaxial wafer as set forth in claim 2, wherein a thickness of the silicon epitaxial layer is in the range from 4 μm through 20 μm.

5. A production method of a silicon epitaxial wafer, comprising the steps of:
    growing a silicon single crystal ingot added with boron and germanium by the Czochralski method;
    producing a silicon wafer having a diameter of at least 300 mm by slicing the ingot; and
    growing an epitaxial layer on a surface of the silicon wafer; wherein
        the silicon wafer is doped to have a boron concentration of $8.5 \times 10^{18}$ (atoms/cm$^3$) or higher; and
        germanium is doped to satisfy a relational expression (formula 1) below:

$$\left| 3 \times \frac{\left( \begin{array}{c} 4.64 \times 10^{-24} \cdot [Ge] - \\ 2.69 \times 10^{-23} \cdot [B] \end{array} \right)}{5.43} \times r^2 \times \frac{t_{epi}}{(t_{sub})^2} \right| \leq 26. \quad \text{[Formula 1]}$$

6. The production method of a silicon epitaxial wafer as set forth in claim 5, wherein a crystal orientation of the silicon wafer is (110).

7. The production method of a silicon epitaxial wafer as set forth in claim 5, wherein a thickness of the silicon epitaxial layer is in the range from 4 μm through 20 μm.

8. The production method of a silicon epitaxial wafer as set forth in claim 6, wherein a thickness of the silicon epitaxial layer is in the range from 4 μm through 20 μm.

* * * * *

UNITED STATES PATENT AND TRADEMARK OFFICE
CERTIFICATE OF CORRECTION

PATENT NO. : 7,816,765 B2
APPLICATION NO. : 12/477207
DATED : October 19, 2010
INVENTOR(S) : Toshiaki Ono Page 1 of 1

It is certified that error appears in the above-identified patent and that said Letters Patent is hereby corrected as shown below:

On the Title Page, insert Item --[30] Foreign Application Priority Data    June 5, 2008 (JP) 2008-148073--.

At Column 9, Line 34, insert --(Note that [B] indicates a boron concentration (atoms/cm$^3$), [Ge] a germanium concentration (atoms/cm$^3$), "r" a wafer radius (μm), $t_{epi}$ an expitaxial growth thickness (μm) and $t_{sub}$ a wafer thickness (μm).)--

At Column 10, Line 25, insert --(Note that [B] indicates a boron concentration (atoms/cm$^3$), [Ge] a germanium concentration (atoms/cm$^3$), "r" a wafer radius (μm), $t_{epi}$ an expitaxial growth thickness (μm) and $t_{sub}$ a wafer thickness (μm).)--.

Signed and Sealed this
Fourteenth Day of June, 2011

David J. Kappos
*Director of the United States Patent and Trademark Office*